US012564060B2

(12) United States Patent
Lee et al.

(10) Patent No.: US 12,564,060 B2
(45) Date of Patent: Feb. 24, 2026

(54) METHOD FOR FORMING A PARTIAL SHIELDING FOR AN ELECTRONIC ASSEMBLY

(71) Applicant: JCET STATS ChipPAC Korea Limited, Incheon (KR)

(72) Inventors: EunByeol Lee, Incheon (KR); DooSoub Shin, Incheon (KR); YeJin Park, Incheon (KR); HyukCheon Kwon, Gyeonggi-do (KR)

( * ) Notice: Subject to any disclaimer, the term of this patent is extended or adjusted under 35 U.S.C. 154(b) by 364 days.

(21) Appl. No.: 18/363,773

(22) Filed: Aug. 2, 2023

(65) Prior Publication Data

US 2024/0055367 A1      Feb. 15, 2024

(51) Int. Cl.
| | |
|---|---|
| *H01L 23/552* | (2006.01) |
| *H01L 21/56* | (2006.01) |
| *H01L 23/31* | (2006.01) |
| *H01Q 1/22* | (2006.01) |
| *H01Q 1/52* | (2006.01) |

(52) U.S. Cl.
CPC ............ *H01L 23/552* (2013.01); *H01L 21/56* (2013.01); *H01L 23/3128* (2013.01); *H01Q 1/2283* (2013.01); *H01Q 1/526* (2013.01)

(58) Field of Classification Search
CPC . H01L 23/66; H01L 2223/6677; H01L 21/50; H01L 21/56; H01L 21/565; H01L 23/552; H01Q 1/2283; H01Q 1/526
USPC ....................................................... 438/127
See application file for complete search history.

(56) References Cited

U.S. PATENT DOCUMENTS

| | | | |
|---|---|---|---|
| 10,937,741 B2 | 3/2021 | Yang et al. | |
| 11,201,386 B2 | 12/2021 | Ho et al. | |
| 2013/0075924 A1* | 3/2013 | Lin ..................... | H01L 23/3128 |
| | | | 438/109 |
| 2014/0126161 A1* | 5/2014 | Chen ..................... | H01L 23/552 |
| | | | 361/748 |
| 2014/0293550 A1* | 10/2014 | Mugiya ................. | H01L 23/552 |
| | | | 361/728 |
| 2015/0036297 A1* | 2/2015 | Chen ................... | H01L 23/3121 |
| | | | 29/841 |
| 2016/0270213 A1 | 9/2016 | Salehi et al. | |

(Continued)

FOREIGN PATENT DOCUMENTS

| | | |
|---|---|---|
| EP | 3803971 A4 | 3/2022 |
| TW | 201117686 A | 5/2011 |

(Continued)

*Primary Examiner* — Didarul A Mazumder
(74) *Attorney, Agent, or Firm* — .Junhe Law Office, P.C.; Yi Zhang

(57) ABSTRACT

Provided is a method for forming a partial shielding for an electronic assembly, comprising: providing an electronic assembly mounted on a mother board, wherein the electronic assembly comprises a substrate, and at least one electronic component and a conductive pattern mounted on a top surface of the substrate; disposing a mask onto the substrate to cover the at least one electronic component; forming an encapsulant layer on the mother board to encapsulate at least the electronic assembly; forming a trench through the encapsulant layer to expose at least a portion of the conductive pattern and at least a portion of lateral surfaces of the mask; forming a shielding layer on the mother board to cover the encapsulant layer and fill in the trench; and detaching the mask from the mother board.

11 Claims, 5 Drawing Sheets

(56)        References Cited

U.S. PATENT DOCUMENTS

| 2019/0164863 | A1* | 5/2019 | Cho | ........................ | H01L 24/32 |
| 2020/0075502 | A1* | 3/2020 | Kim | .................... | H01Q 1/2283 |
| 2020/0305314 | A1* | 9/2020 | Lear | .................... | H05K 9/0037 |
| 2024/0234507 | A1* | 7/2024 | Sampath | .............. | H10D 12/031 |

FOREIGN PATENT DOCUMENTS

| TW | 201841059 | A | 11/2018 |
| TW | 202129897 | A | 8/2021 |
| TW | I756105 | B | 2/2022 |
| TW | 202224522 | A | 6/2022 |
| WO | 02089209 | A1 | 11/2002 |

* cited by examiner 470
460
430
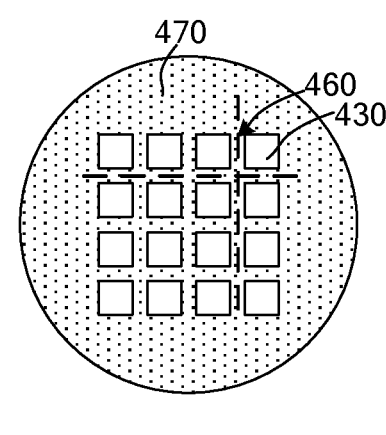
FIG. 4A
430
a
430
b
430
406
400
FIG. 4B
506    506
580
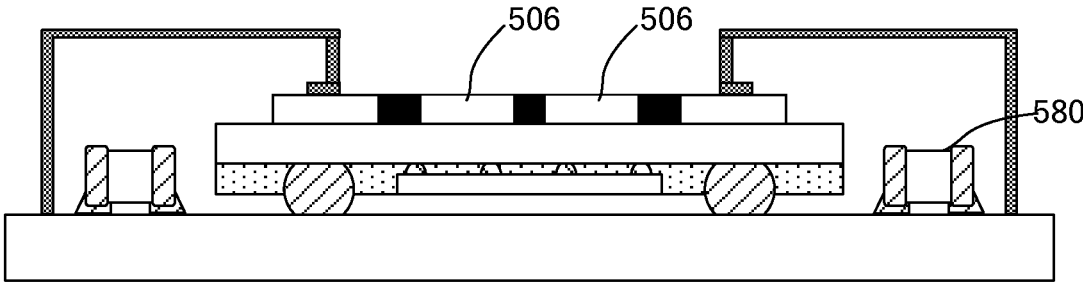
FIG. 5

METHOD FOR FORMING A PARTIAL SHIELDING FOR AN ELECTRONIC ASSEMBLY

TECHNICAL FIELD

The present application generally relates to semiconductor technologies, and more particularly, to a method for forming a partial shielding for an electronic assembly.

BACKGROUND OF THE INVENTION

Semiconductor devices are commonly found in modern electronic products, which perform a wide range of functions, such as signal processing, high-speed computing, transmitting and receiving electromagnetic signals, controlling electronic devices, and creating visual images for television displays. Various electronic components can be fabricated within a semiconductor device to perform certain functions such as calculation or memory. In order to protect the electronic components inside an electronic assembly or a semiconductor device from electromagnetic interference (EMI), a conformal shielding can be conventionally coated over the entire semiconductor device, which can reduce the magnitude of EMI radiation entering and exiting the semiconductor device. Some semiconductor devices that perform wireless communication functions are also equipped with a transceiver module for receiving signals from and/or transmitting signals to exterior devices. In such devices, the afore-mentioned conformal shielding blocks desired electromagnetic radiation from/to the exterior devices. Therefore, for an electronic assembly integrated with a transceiver module, a partial shielding that selectively and effectively performs EMI shielding is desired.

Conventionally, a laser ablation process can be used to remove solid materials at intended locations of a conformal shielding to obtain a partial shielding. For example, for an antenna module under a conformal shielding that needs to be exposed, an encapsulant layer and/or a shielding layer may be partially removed by the laser ablation process to form a cavity for the antenna module, which at least partially exposes the antenna module. Yet, the laser ablation process may be complicated since a successful laser ablation process for forming the partial shielding depends on various factors. For example, the laser energy of the laser ablation process needs to be compatible with the material to be removed to achieve a desired cavity. Further, the beam energy density, the laser pulse duration, and the laser wavelength, etc. are also other factors to be considered for a specific application. A wrong configuration profile may cause undesired damage to the electronic component, thereby, the yield of such electronic assembly may be reduced.

Therefore, a need exists for an improved method for forming a partial shielding for an electronic assembly.

SUMMARY OF THE INVENTION

An objective of the present application is to provide a method for forming a partial shielding for an electronic assembly, which achieves low lost and high yield.

According to one aspect of the present application, a method for forming a partial shielding for an electronic assembly is provided, comprising: providing an electronic assembly mounted on a mother board; wherein the electronic assembly comprises a substrate, and at least one electronic component and a conductive pattern mounted on a top surface of the substrate; disposing a mask onto the substrate to cover the at least one electronic component; forming an encapsulant layer on the mother board to encapsulate at least the electronic assembly; forming a trench through the encapsulant layer to expose at least a portion of the conductive pattern and at least a portion of lateral surfaces of the mask; forming a shielding layer on the mother board to cover the encapsulant layer and fill in the trench; and detaching the mask from the mother board.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain the principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

FIG. 4A illustrates an exemplary wafer with multiple semiconductor dice attached to an adhesive film.

FIG. 4B illustrates a cross-sectional view of an electronic assembly using a dummy die with adhesive as a mask according to an embodiment of the present application.

FIG. 5 illustrates a cross-sectional view of an electronic assembly according to another embodiment of the present application.

The same reference numbers will be used throughout the drawings to refer to the same or like parts.

DETAILED DESCRIPTION OF THE INVENTION

Figure 1A:
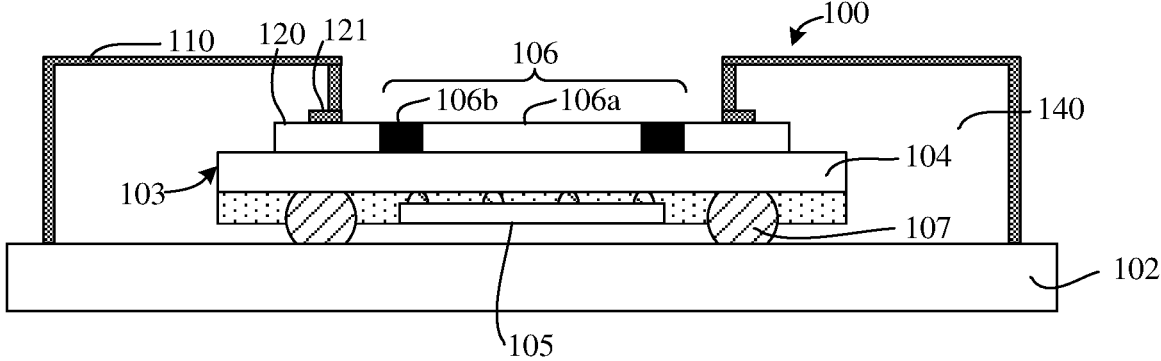
FIG. 1A illustrates a cross-sectional view of an electronic assembly formed with a partial shielding according to an embodiment of the present application.

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

In semiconductor devices, multiple electronic components of various functions may be integrated in a single assembly. For example, semiconductor dice, semiconductor packages, integrated passive components, discrete active or passive electrical components as well as antennas may be integrated together as an electronic assembly. On the one hand, some electronic components may be susceptible to electromagnetic interference (EMI), radio frequency interference (RFI), harmonic distortion, or other inter-device interferences, such as capacitive, inductive, or conductive coupling, also known as cross-talks, which can interfere with the operation of these components. Such interferences may be generated both from exterior devices outside the assembly and from such as high-speed switching of digital circuits inside the same assembly. Therefore, for protection purpose, a shielding, especially an EMI shielding, may be desired. On the other hand, a shielding may be undesired, for example, for some electronic components such as an antenna module used to convert between an electromagnetic radiation signal sent or received over the airwaves and an electrical signal within the electronic assembly. The transceiver functionality of the electronic assembly will be facilitated by not having a full shielding formed over the antenna module, which could block desirable signals.

As can be seen, different electronic components in an electronic assembly may require different shielding configurations. To solve the problem, a partial shielding may be desired to selectively shield the electronic assembly, thereby providing different shielding configurations as needed by different electronic components of the assembly. Conventionally, a partial shielding may be formed by performing a laser ablation process to an electronic assembly that is conformally shielded. Yet, as illustrated above, the laser ablation process may be complicated, and of low yield and high cost.

According to some embodiments of the present application, a method for forming a partial shielding for an electronic assembly is provided. Instead of using laser ablation, the method adopts a mask with easy attachment to and detachment from the electronic assembly, which reduces the cost and improves the yield.

Referring to FIG. 1A, an electronic assembly 100 formed with a partial shielding according to an embodiment of the present application is illustrated.

As shown in FIG. 1A, the electronic assembly 100 includes a mother board 102 and multiple electronic components mounted on the mother board 102. In an embodiment, the electronic component mounted on the mother board 102 may be a semiconductor package 103, which includes a substrate 104, an encapsulated semiconductor die 105 mounted on a bottom surface of the substrate 104, and an antenna module 106 mounted on a top surface of the substrate 104. A conductive pattern 120 is formed on the top surface and around the antenna module 106, and the conductive pattern 120 may be electrically connected to the antenna module 106 via interconnect structures (not shown) within the substrate 104. In some embodiments, the conductive pattern 120 surrounding the antenna module 106 is formed as a conductive ring. An additional conductive pattern 121 may be optionally disposed on top of the conductive pattern 120.

The antenna module 106 may include an antenna 106a, which provides transmission function and may take the form of inductive coil, and an encapsulant or molding compound 106b deposited around and optionally over the antenna 106a. Note that the encapsulant or molding compound 106b may not be present in some other embodiments. Both the semiconductor die 105 and the antenna module 106 may be electrically and mechanically coupled to the substrate 104 via such as solder balls, and the substrate 104 may be further electrically coupled to the mother board 102 via solder balls 107.

Further referring to FIG. 1A, a partial shielding is formed on the mother board 102 using a method according to an embodiment of the present application. In particular, an overall structure of the semiconductor package 103 is encapsulated with a partial encapsulant 140 to provide the electronic assembly 100 with structural support and protection against external contaminants. Furthermore, a partial shielding layer 110 is formed over the electronic assembly 100, or particularly over the partial encapsulant 140, to protect the electronic components from being affected by such as exterior radiation.

Figure 1B:
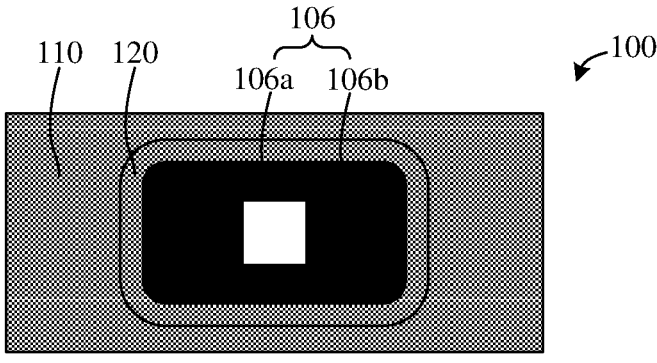
FIG. 1B illustrates a top view of the electronic assembly in FIG. 1A according to an embodiment of the present application.

Referring to FIG. 1B, a top view of the electronic assembly 100 shown in FIG. 1A is illustrated. As shown in FIG. 1B, the antenna module 106 includes the antenna 106a and the encapsulant or molding compound 106b, and is exposed to the exterior environment. Surrounding the antenna module 106 is the ring-shaped conductive pattern 120. The partial shielding layer 110 covers an area outside the conductive pattern 120. The antenna 106a is disposed within the center of the cavity of the partial shielding layer 110 and the partial encapsulant layer (not shown).

Figure 2:
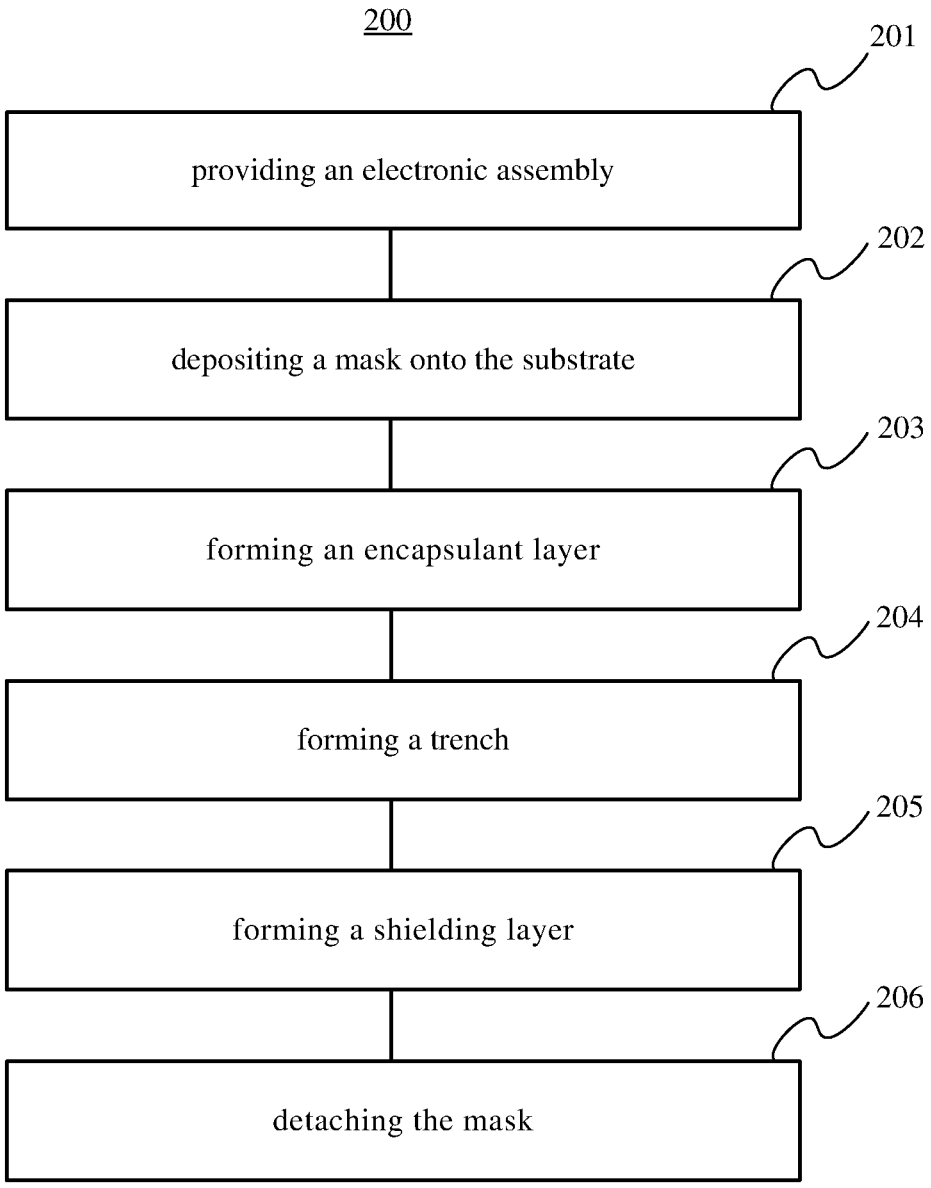
FIG. 2 illustrates a flowchart of a method for forming a partial shielding according to an embodiment of the present application.

FIG. 2 is a flowchart illustrating a method 200 for forming a partial shielding for an electronic assembly. The method 200 can be used to manufacture an electronic assembly with an open cavity such as the electronic assembly 100 shown in FIGS. 1A and 1B, which enables selective shielding for electronic components integrated within such electronic assembly.

Firstly, in block 201, an electronic assembly to be processed is provided, wherein some electronic components of the electronic assembly are desired to be unshielded, e.g., an antenna module. Then, in block 202, a mask is disposed onto a substrate of the electronic assembly to cover at least part of the electronic components desired to be unshielded. Further, in block 203, an encapsulant layer is formed on a mother board for the electronic assembly to encapsulate the electronic assembly. In block 204, a trench is formed through the encapsulant layer to expose at least a portion of a conductive pattern on the substrate and at least a portion of lateral surfaces of the mask. In block 205, a shielding layer is formed on the mother board to cover the encapsulant layer and fill in the trench. Finally, in block 206, the mask is detached from the mother board. Each step is illustrated below in more details.

FIGS. 3A-3F show cross-sectional views of the steps of the method depicted in FIG. 2 according to an embodiment of the present application.

Figure 3A:
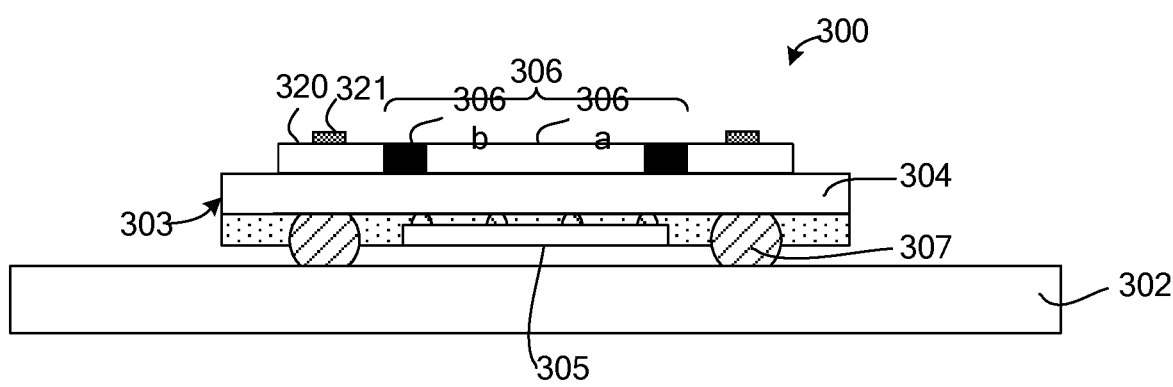
FIGS. 3A-3F illustrate cross-sectional views of the steps of the method in FIG. 2 according to an embodiment of the present application.

Referring to FIG. 3A, an electronic assembly 300 includes a mother board 302 and multiple electronic components mounted thereon. In particular, a semiconductor package 303, which includes a substrate 304, an encapsulated semiconductor die 305 and an antenna module 306, is mounted on the mother board 302. In the embodiment, the semiconductor die 305 is mounted on a bottom surface of the substrate 304, facing towards a top surface of the mother board 302, while the antenna module 306 is mounted on a top surface of the substrate 304 and facing away from the mother board 302. However, in some other embodiments, the semiconductor die 305 may be disposed on the top surface of the substrate 304, i.e., on the same side as the antenna module 306. The substrate 304 may include conductive structures on its top and bottom surfaces, and interconnect structures within the substrate 304 to achieve electrical connection between the respective conductive structures on the top and bottom surfaces (not shown). The semiconductor die 305 and the antenna module 306 are electrically and mechanically coupled to the substrate 304 via such as solder balls (for the antenna module 306 not shown). The substrate 304 is electrically coupled to the mother board 302 via for example solder balls 307.

In one embodiment, the antenna module 306 may be a transceiver device that may include an antenna and some other electronic components, such as an amplifier, to convert between a desirable electromagnetic radiation signal sent or received over the airwaves and an electrical signal within the electronic assembly. In another embodiment, the antenna module 306 may be a discrete antenna module that provides radio frequency (RF) communications by transmitting and receiving RF signals. The discrete antenna module may include one or more antennas and optionally interleaving conductive layers, conductive vias and insulating layers, depending on the design and function of the discrete antenna module. In some embodiments, the antenna module 306 may be formed using a printed circuit board (PCB) manufacturing process. For example, the antenna module 306 may be embedded into a PCB-like plate or substrate using a build-up process used in the PCB manufacturing process.

Further referring to FIG. 3A, the antenna module 306 may include an antenna 306a, which provides transmission function and may take the form of inductive coil, and an encapsulant or molding compound 306b deposited around and optionally over the antenna 306a. The encapsulant or molding compound 306b may be formed by paste printing, compressive molding, transfer molding, liquid encapsulant molding, vacuum lamination, spin coating, or other suitable processes. The encapsulant or molding compound 306b can be a polymer composite material, such as epoxy resin with filler, epoxy acrylate with filler, photoresist or polymer with proper filler. In some embodiments, the encapsulant or molding compound 306b may include no filler. The encapsulant or molding compound 306b may be non-conductive, provides structural support, and environmentally protects the functional module 306a from external elements and contaminants.

The antenna module 306 is electrically connected to the substrate 304 via certain interconnect structures which may be bond wires, conductive paste, stud bump, micro bump, or the like. For example, electrically conductive bump (not shown) may be deposited using evaporation, electrolytic plating, electroless plating, ball drop, or screen printing process. The bump material can be Al, Sn, Ni, Au, Ag, Pb, Bi, Cu, solder, and combinations thereof, with an optional flux solution.

Preferably, as shown in FIG. 3A, a conductive pattern 320 is formed around the antenna module 306. The conductive pattern 320 may be electrically connected to the antenna module 306 via interconnect structures (not shown) within the substrate 304. In some embodiments, the conductive pattern 320 surrounding the antenna module 306 is formed as a conductive ring, which may be, as will be illustrate below, further electrically connected to a shielding layer and preferably a ground node, so as to aid the interference blocking capability of the shielding layer. Preferably, the conductive pattern 320 surrounding the antenna module 306 can be formed as a continuous or discontinuous ring. It can be appreciated that a height of the antenna module 306 and a height of the conductive pattern 320 are only illustrative, not representing the actual proportion. It can also be appreciated that the conductive pattern 320 can be formed as any predefined pattern. In some embodiments, the antenna 306a and the conductive pattern 320 may be formed in a single process.

Further referring to FIG. 3A, on top of the conductive pattern 320, an additional conductive pattern 321 may be optionally disposed. In an embodiment, the additional conductive pattern 321 may be shaped as a ring or a rectangle, which may enclose a cavity above the antenna module 306 to position the mask to be mounted therein. An area of the additional conductive pattern 321 may be equal to or smaller than an area of the conductive pattern 320. In some embodiments, both the conductive pattern 320 and the additional conductive pattern 321 are formed on the substrate 304 using a Solder-on-Pad (SOP) process. Preferably, the conductive pattern 320 and/or the additional conductive pattern 321 may be formed using plating such as Au plating, so as to enhance electrical connection between a shielding layer to be formed on the substrate 304 and the substrate 304. The plating process may further improve the yield. Preferably, the additional conductive pattern 321 may be constructed that an inner periphery of the additional conductive pattern 321 and an inner periphery of the conductive pattern 320 vertically align with each other. Preferably, the additional conductive pattern 321 surrounding the antenna module 306 can be formed as a continuous or discontinuous ring. It can be appreciated that the forming of the afore-mentioned conductive pattern may adopt other suitable processes. In the next step, the additional conductive pattern 321 may serve as an anchor point for a mask to be disposed on the antenna module 306, as will be elaborated below. As afore-mentioned, in some embodiments, the conductive pattern 320 and the additional conductive pattern 321 may be formed by a built-up process used in a PCB manufacturing process. It can be appreciated that the structure of the semiconductor package 303 is exemplary, which may be modified depending on the actual needs for the electronic assembly 300.

Figure 3B:
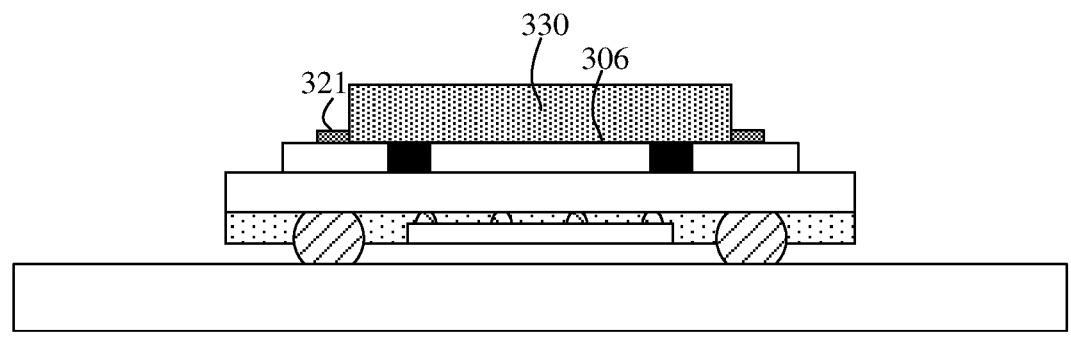

Referring to FIG. 3B, a mask 330 is then disposed onto the antenna module 306. The shape and size of the mask 330 may be configured according to the shape and size of the antenna module 306 which is desired to be exposed in the finalized electronic assembly. In some embodiments, the mask 330 may cover an entirety of the antenna module 306, while in some alternative embodiments, the mask 330 may cover a portion of the antenna module 306. Preferably, the mask 330 may have an area larger than or equal to an area of a top surface of the antenna module 306. Preferably, the mask 330 may have an area equal to an area delineated by the additional conductive pattern 321 on top of the conductive pattern 320. In some embodiments, the mask 330 may be one or more of an adhesive tape, an ultraviolet (UV) tape, a thermal tape, metal without adhesive, metal with adhesive, polymer without adhesive, and polymer with adhesive. Optionally, a metal foil film, a metal foil tape, a polyimide film, or any other suitable flexible mask can be used as mask 330. In some other embodiments, the mask 330 may be a metal, plastic, or silicon mask or other rigid mask. The mask 330 can include adhesive to provide a mechanical attachment of the mask 330 to the antenna module 306, yet, the mask 330 may also attach to the antenna module 306 in other ways. Preferably, the mask 330 may be a polymer with adhesive. The adhesive can be UV release, thermal release, or otherwise configured to allow for convenient removal of the mask 330 from the antenna module 306. The mask 330 can also be any suitable insulating, passivation, or photoresist layer deposited by any appropriate thin film deposition technique. It can be appreciated that the adhesive may cover any surface(s) of the mask, preferably all outer surfaces or a bottom surface of the mask 330 to achieve desired attachment and detachment. In some embodiments, the mask 330 may be placed on the electronic assembly via a pick and place machine or any other suitable mechanism.

Figure 3C:
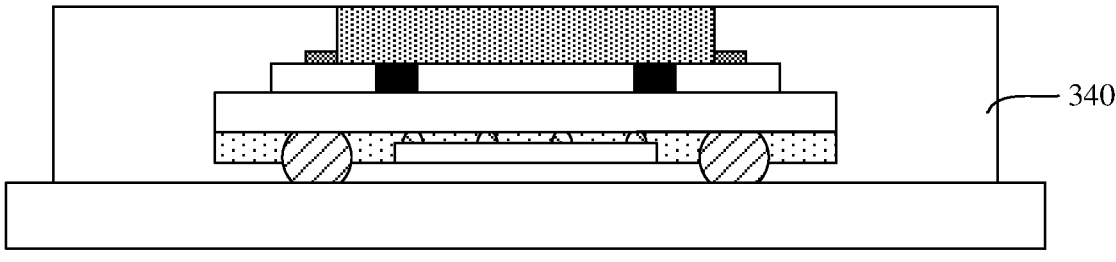

Referring to FIG. 3C, an encapsulant layer 340 may be formed on the mother board to cover the electronic assembly. Preferably, the encapsulant layer 340 may have a height equal or greater than a height of the electronic assembly (including the mask). That is, the mask topmost of the electronic assembly can be exposed from the encapsulant layer 340. In some embodiments, the encapsulant layer 340 may be formed having a height greater than the height of the electronic assembly, thereby the mask is also fully encapsulated. Then the encapsulant layer 340, which fully encapsulates the mask, may then be grinded to expose a top surface of the mask. The encapsulant layer 340 may be deposited via paste printing, compressive molding, transfer molding, liquid encapsulant molding, vacuum lamination, spin coating, or another suitable applicator. Preferably, the encapsulant layer 340 is formed using an injection molding process. The encapsulant layer 340 can be a polymer composite material, such as epoxy resin, epoxy acrylate, or any suitable polymer with or without filler. The encapsulant layer 340 may be non-conductive, provides structural support, and environmentally protects the electronic assembly from external elements and contaminants.

Figure 3D:
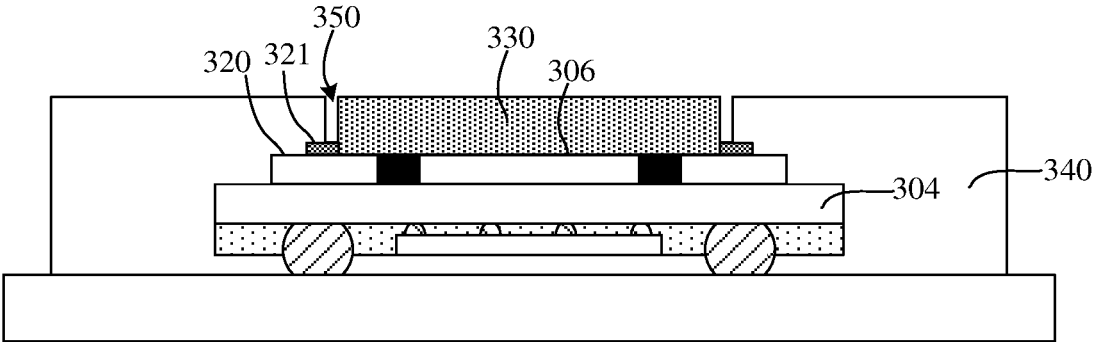

Referring to FIG. 3D, a trench 350 is formed through the encapsulant layer 340 and adjacent to the mask 330. In the case that only the conductive pattern 320 is disposed and the additional conductive pattern 321 is not disposed on the substrate, the trench 350 has a depth such that at least a portion of the conductive pattern 320 can be exposed through the trench 350. Also, the trench 350 can expose at least a portion of lateral surfaces of the mask 330. The trench 350 exposing the lateral surfaces of the mask 330 can avoid encapsulant material attached to the mask 330, which may increase the difficulty of detachment the mask 330 from the antenna module 306 in the subsequent process. In the case that both the conductive pattern 320 and the additional conductive pattern 321 are disposed on the substrate, as shown in FIG. 3D, the trench 350 has a depth that at least a portion of the additional conductive pattern 321 is exposed through the trench. Similarly, at least a portion of lateral surfaces of the mask 330 can be exposed through the trench 350. Preferably, the trench 350 may be formed at a boundary where a conductive pattern is in contact with the mask 330. In this case, the shielding layer (usually conductive) to be disposed into the trench 350 may electrically connect to the conductive pattern. Furthermore, there may be clearances around the mask 330 for further detachment of the mask 330. The trench 350 may be continuous or discontinuous around the mask 330. In the case that the position of the trench 350 is not aligned with the position of the conductive pattern underneath, the trench 350 may expose the substrate 304. In this case, the trench 350 may not be aligned to a circuitry that cannot be grounded/connected to a shielding layer. The trench 350 can be formed by chemical etching with a photolithographic mask, laser ablation, saw cutting, reactive ion etching, or another suitable trenching process.

Figure 3E:
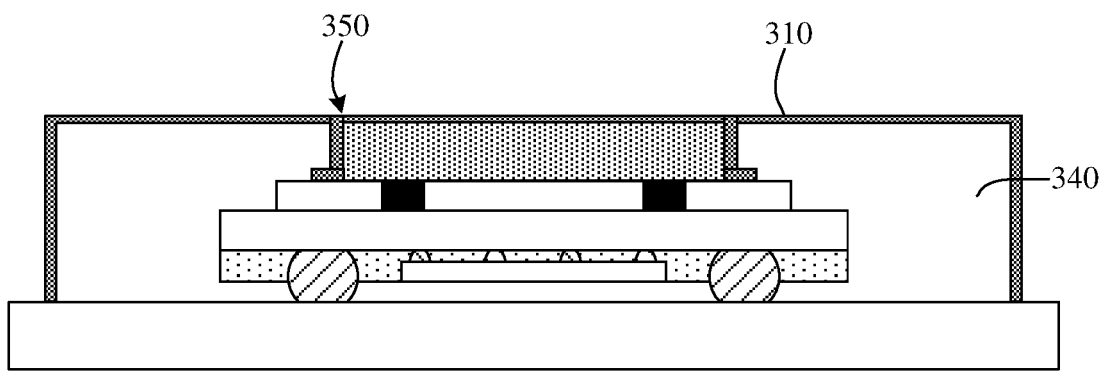

Referring to FIG. 3E, a conformal shielding layer 310 is then formed on the mother board to cover the encapsulant layer 340 and fill in the trench 350. The shielding layer 310 is formed by spray coating, plating, sputtering, or any other suitable metal deposition process. Preferably, the shielding process is performed using sputtering. The shielding layer 310 can be formed from copper, aluminum, iron, or any other suitable material for EMI shielding. Preferably, the shielding layer 310 is thick enough such that the trench 350 may be filled to electrically connect the shielding layer 310 with the underneath conductive pattern. Specifically, all exposed surfaces of the encapsulant layer 340 and the trench 350 are coated by a shielding material, which is generally conductive. Since that the trench 350 is deep enough to expose the conductive pattern on the substrate, the shielding layer 310, which includes the shielding layer over the encapsulant 340 and the shielding layer in the trench 350, are all electrically connected to the conductive pattern on the substrate. Preferably, in the case that the conductive pattern is to be grounded in operation, for example, electrically coupled to a ground node, the shielding layer is thereby grounded, which enhances the shielding performance for the electronic assembly.

Figure 3F:
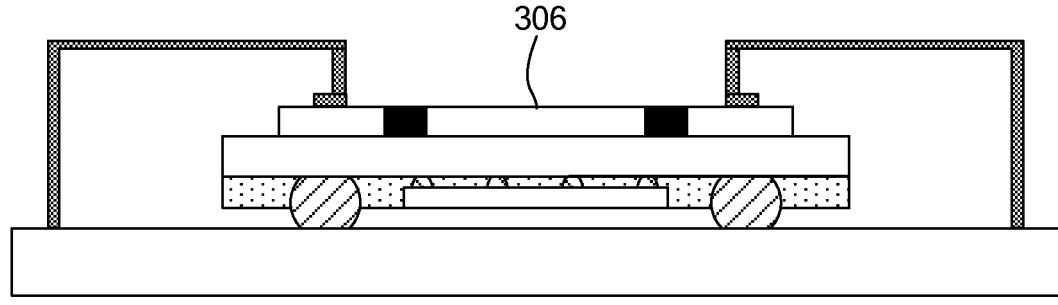

Referring to FIG. 3F, the mask 330 is detached from the electronic assembly, along with a portion of the shielding layer thereon, such that the antenna module 306 is exposed from the encapsulant layer and the shielding layer. As shown in FIG. 3F, other electronic components, such as the semiconductor die mounted on the bottom surface of the substrate, remain shielded by the shielding layer. As a result, a partial shielding is formed. Preferably, the same pick and place machine that places the mask 330 onto the electronic assembly can be used to detach the mask 330 from the electronic assembly. In some other embodiments, a tool capable of freely rotating the electronic assembly around any and all axes may be adopted, such that the mask 330 may drop outside the electronic assembly.

Referring to FIGS. 4A and 4B, it shows an electronic assembly 400 according to an embodiment of the present application. In some embodiments, a mask 430 may adopt a dummy die with adhesive 430, which include a dummy die 430a and an adhesive film 430b attached thereto with a same area, separated from a dummy wafer with adhesive film 470. FIG. 4A illustrates a dummy wafer 470 including multiple dummy dice with an adhesive film attached to its backside. After singulating the dummy die with adhesive 430 from the dummy wafer with adhesive film 470 at the inter-die wafer area or saw street 460, the dummy die with adhesive 430 may be disposed onto an antenna module 406 to serve as a mask 430, wherein the adhesive film 430*b* is in contact with the antenna module 406, so as to provide intimate engagement between the mask 430 and the antenna module 406. In particular, the adhesive film 430*b* may attach the dummy die 430*a* to the antenna module 406 such that in a further encapsulation of the electronic assembly, minimal encapsulation material may be permeated on the surface of the antenna module 406, which may lead to undesired shielding effect. The adhesive film 430*b* can be ultraviolet (UV) release, thermal release, or otherwise configured to allow for convenient removal of the adhesive film 430*b*. The adhesive film 430*b* can also be any suitable insulating, passivation, or photoresist layer deposited by any appropriate thin film deposition technique. Removal of the adhesive film 430*b* may facilitate the removal of the entirety of the mask 430.

Referring to FIG. 5, for multiple antenna modules 506 located in an adjacent area, the present method with a single mask may also apply. In some embodiments, there may also be other electronic components 580 mounted on the mother board. In such cases, for the electronic components 580, the partial shielding layer formed with the present application may at least partly shield the radiation from the antenna modules 506, in addition to shielding EMI from exterior environment.

It can be appreciated that the antenna module referred to in the above embodiments can be any electronic components that desire to be not shielded. Aspects of the present application are not limited thereto.

The discussion herein included numerous illustrative figures that showed various portions of a method for forming a partial shielding for an electronic assembly. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for forming a partial shielding for an electronic assembly, comprising:

providing an electronic assembly mounted on a mother board, wherein the electronic assembly comprises a substrate, and at least one electronic component and a conductive pattern mounted on a top surface of the substrate;

disposing a mask onto the substrate to cover the at least one electronic component;

forming an encapsulant layer on the mother board to encapsulate at least the electronic assembly;

forming a trench through the encapsulant layer to expose at least a portion of an additional conductive pattern disposed on the conductive pattern and at least a portion of lateral surfaces of the mask;

forming a shielding layer on the mother board to cover the encapsulant layer and fill in the trench; and detaching the mask from a top surface of the electronic assembly.

2. The method according to claim 1, wherein after providing the electronic assembly mounted on the mother board, the method further comprises:

forming the additional conductive pattern on the conductive pattern; and wherein the additional conductive pattern is not covered by the mask and is exposed through the trench.

3. The method according to claim 2, wherein the conductive pattern and the additional conductive pattern are both formed using plating process.

4. The method according to claim 1, wherein forming the encapsulant layer on the mother board comprises:

forming the encapsulant layer that does not cover a top surface of the mask.

5. The method according to claim 1, wherein the conductive pattern surrounds the at least one electronic component.

6. The method according to claim 1, wherein forming the encapsulant layer on the mother board comprises:

forming the encapsulant layer using an injection molding process.

7. The method according to claim 1, wherein the mask is a sawed dummy die with an adhesive, wherein upon disposing the mask onto the substrate to cover the at least one electronic component, the adhesive is in contact with the at least one electronic component.

8. The method according to claim 1, wherein the mask is made of one or more of an adhesive tape, a UV tape, a thermal tape, a metal without adhesive, a metal with adhesive, a polymer without adhesive, and a polymer with adhesive.

9. The method according to claim 1, wherein the encapsulant layer on the mother board is formed using sputtering process.

10. The method according to claim 1, wherein the conductive pattern is electrically grounded.

11. The method according to claim 1, wherein the at least one electronic component comprises an antenna module.

* * * * *